(12) United States Patent
Sundarrajan et al.

(10) Patent No.: US 6,454,919 B1
(45) Date of Patent: Sep. 24, 2002

(54) PHYSICAL VAPOR DEPOSITION APPARATUS WITH DEPOSITION AND DC TARGET POWER CONTROL

(75) Inventors: Arvind Sundarrajan, Santa Clara; Dinesh Saigal, San Jose, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/672,226

(22) Filed: Sep. 27, 2000

Related U.S. Application Data

(62) Division of application No. 09/059,852, filed on Apr. 14, 1998, now Pat. No. 6,177,350.

(51) Int. Cl.$^7$ .......................... C23C 14/34; C23C 16/00; B05C 11/00
(52) U.S. Cl. ............................. 204/298.02; 204/298.03; 118/712; 118/715
(58) Field of Search ................... 204/298.02, 298.03, 204/298.13; 118/712, 715

(56) References Cited

U.S. PATENT DOCUMENTS

| | | | |
|---|---|---|---|
| 4,816,126 A | 3/1989 | Kamoshida et al. ...... 204/192.3 |
| 4,994,162 A | 2/1991 | Armstrong et al. .... 204/192.15 |
| 5,108,570 A | 4/1992 | Wang ...................... 204/192.3 |
| 5,171,412 A | 12/1992 | Talieh et al. ........... 204/192.15 |
| 5,186,718 A | 2/1993 | Tepman et al. ............. 29/25.01 |
| 5,330,628 A | 7/1994 | Demaray et al. ....... 204/192.12 |
| 5,371,042 A | 12/1994 | Ong ............................. 437/194 |
| 5,693,564 A | 12/1997 | Yu ............................... 438/646 |
| 5,800,688 A | * 9/1998 | Lantsman et al. ...... 204/298.11 |
| 5,804,251 A | 9/1998 | Yu et al. ...................... 427/250 |
| 5,843,837 A | 12/1998 | Baek et al. .................. 438/627 |
| 5,877,086 A | 3/1999 | Aruga ........................ 438/653 |
| 5,882,399 A | 3/1999 | Ngan et al. ................. 438/648 |
| 5,911,113 A | 6/1999 | Yao et al. .................... 438/649 |
| 5,913,146 A | 6/1999 | Merchant et al. ........... 438/646 |
| 5,962,923 A | 10/1999 | Xu et al. ..................... 257/774 |
| 5,985,759 A | 11/1999 | Kim et al. ................... 438/653 |

FOREIGN PATENT DOCUMENTS

| | | | |
|---|---|---|---|
| EP | 0485130 | 5/1992 | ......... H01L/21/285 |
| EP | 0655780 | 5/1995 | ......... H01L/21/768 |
| EP | 0799903 | 10/1997 | ........... C23C/14/14 |

OTHER PUBLICATIONS

S. M. Rossnagel and J. Hopwood, "Metal ion deposition from ionized magnetron sputtering discharge", *J. Vac. Sci. Technol. B*, vol. 12, No. 1, pp. 449–453 (Jan./Feb. 1994).

Gongda Yao, "Local Thermodynamic Analysis for Aluminum Planarization", Applied Materials HP PVD Update, vol. 2, No. 4, pp. 10–12 (Dec. 1995).

* cited by examiner

*Primary Examiner*—Steven H. Ver Steeg
(74) *Attorney, Agent, or Firm*—Shirley L. Church; Kathi Bean

(57) ABSTRACT

A physical vapor deposition apparatus is provided with at least one workpiece processing chamber and a programmable control device for controlling process variables within the processing chamber. The control device is programmed to vary the power to an aluminum sputtering target during deposition of aluminum layers. By controlling the applied power, the rate of deposition of the aluminum is varied in a manner which reduces or avoids the creation of voids during the filling of high aspect ratio features.

12 Claims, 1 Drawing Sheet

PHYSICAL VAPOR DEPOSITION APPARATUS WITH DEPOSITION AND DC TARGET POWER CONTROL

This application is a divisional application of co-pending application Ser. No. 09/059,852, filed Apr. 14, 1998 now U.S. Pat. No. 6,177,350 B1.

BACKGROUND OF THE INVENTION

1. Field of the Invention

The present invention pertains to an improved method for forming a multi-layered aluminum-comprising structure on a substrate having a patterned dielectric surface. In particular, the present invention pertains to a method for performing second layer metallization of multi-layered semiconductor structures using a single-step, high temperature aluminum metallization method, without need for deposition of a nucleation layer of aluminum.

2. Brief Description of the Background Art

Aluminum multilayer metallization technology is used to deposit aluminum plugs which make contacts between metallization layers or levels and to deposit interconnect lines between contacts on a given layer or level. In the past, aluminum metallization of both contacts and interconnects was achieved by one of two methods: reflow or multistep deposition. In the reflow method, aluminum is deposited onto the wafer in a standard aluminum chamber. The wafer is subsequently transferred into an aluminum reflow chamber, where the wafer is heated to temperatures within the range of approximately 500° C. to supply the aluminum with sufficient energy to reflow and thus to create a void-free contact or via.

Using the multi-step deposition method, a wetting layer is first deposited, followed by deposition of a nucleation layer of aluminum at a low temperature, ranging from about 25° C. to about 150° C. The wafer is then heated to 430–480° C. and aluminum is deposited over the nucleation layer to fill the contact or via. The nucleation layer and the fill layer of aluminum can be deposited in a two-chamber configuration (one chamber operated over the 25° C. to 150° C. temperature range, followed by a second chamber, operated over the 430–480° C. temperature range). In the alternative, a single chamber configuration can be used, where the nucleation layer is deposited without the application of heat to the backside of the wafer, and then the fill step is performed with the application of heat to the backside of the wafer.

Examples of prior art aluminum deposition methods are described below:

U.S. Pat. No. 4,816,126, issued Mar. 28, 1989 to Kamoshida et al., discloses a method for forming a planarized aluminum or aluminum alloy film wherein charged particles are irradiated over a thin film formed or being formed on a convex and concave surface of a substrate. During the irradiation, a rise in temperature of the thin film and impingement of charged particles cause the fluidization of the thin film, so that a planarized thin film is formed in a short period of time.

U.S. Pat. No. 5,108,570, issued Apr. 28, 1992 to Wang, and assigned to the assignee of the present invention, discloses a multi-step aluminum sputtering process. The first step of the process comprises sputtering from about 200 to about 2000 Å of aluminum while the wafer temperature is within a range of from about 50° C. to about 250° C., and the sputtering plazma is at a power of from about 1 to about 16 kW. The power level range is then changed to from about 14 to about 20 kW, a DC or AC bias is applied to the wafer, and aluminum is sputtered either for an additional time period of about 20 to about 40 seconds, or until the wafer temperature reaches 500° C., whichever occurs first. Then, the back side of the wafer is contacted by a thermally conductive gas to control the wafer temperature while further aluminum is optionally sputtered onto the wafer for an additional 0 to 45 seconds.

U.S. Pat. No. 5,171,412, issued Dec. 15, 1992 to Talieh et al., and assigned to the assignee of the present invention, discloses a material deposition method comprising a first, low temperature deposition step, followed by a second, high temperature/high power deposition step. In the first deposition step, a collimation plate is placed between the sputtering target and the substrate, such that a collimated stream of sputtered material is deposited upon the substrate. The collimated stream provides a seed layer which aids in eliminating voids by partially filling the holes and grooves in the surface of the substrate. The second deposition step is conducted as a high temperature sputtering deposition. At the high temperature, the sputtered material joins and flows with the seed layer, whereby the holes and grooves are more easily filled without voids, and an improved planarized layer is achieved.

U.S. Pat. No. 5,330,628, issued Jul. 19, 1994 to Demaray et al., discloses a method of depositing a step coating on a workpiece, comprising the steps of (i) preheating the workpiece to a first elevated temperature, (ii) depositing an initial coating on the workpiece by sputtering at a first rate for a first predetermined period of time, (iii) sputtering at a second rate for a second predetermined period of time, which is longer in duration than the first predetermined period of time, and the second rate of sputtering being slower than the first rate, (iv) increasing the temperature of the workpiece to a second temperature, which is higher than the first temperature, and (v) depositing an additional coating on the workpiece while the temperature of the workpiece is being increased.

U.S. Pat. No. 5,371,042, issued Dec. 6, 1994 to Ong, and assigned to the assignee of the present invention, discloses a method of filling vias and openings in semiconductor devices. The method comprises the steps of (i) faceting the tops of the openings, (ii) depositing a barrier layer (e.g., titanium nitride), (iii) treating the barrier layer to reduce its porosity, (iv) depositing a titanium-containing wetting layer, (v) sputter depositing a first layer of aluminum at low temperatures, and (vi) sputter depositing a second layer of aluminum at high temperatures to fill the opening and planarize the layer.

Commonly assigned, U.S. Pat. 5,962,923 to Xu et al., issued Oct. 5, 1999, discloses a method of forming an electrical contact having an aspect ratio greater than 1:1 in a multi-layered integrated circuit. The method includes the following steps: (a) depositing at least one layer of material (a portion of which is a refractory metal and a portion of which is a refractory metal compound) over the surface of an opening (i.e., a through-hole) through which an electrical contact is to pass; and (b) depositing at least one layer of a conductive sputtered material over the surface of the layer which includes the refractory metal, until the through-hole is filled with the conductive material. The step of filling the opening with conductive material includes the steps of depositing the conductive material layer at a temperature below about 150° C. to form a seed (i.e., nucleation) layer, and then continuing to deposit the conductive material layer while maintaining the substrate at a "reflow" temperature (i.e., between about 350° C. to 400° C).

A method for performing void-free metallization of multi-layered semiconductor structures using a single-step, aluminum metallization method, without need for deposition of a nucleation layer of aluminum or for a reflow step to fill voids created during metallization, would be highly advantageous. It would also be desirable to provide a rapid, efficient, aluminum metallization method which can be performed within a single processing chamber.

SUMMARY OF THE INVENTION

Applicants have discovered a method for performing second layer metallization of multi-layered semiconductor structures using a single-step, high temperature aluminum deposition method which does not require deposition of a nucleation layer of aluminum or a reflow step to fill voids formed during metallization.

Accordingly, disclosed herein is a method for forming a multi-layered aluminum-comprising structure on a substrate having a patterned dielectric surface, wherein the improvement comprises: (a) sputter etching the patterned dielectric surface; (b) depositing at least one continuous wetting layer of titanium over the patterned dielectric surface using ion sputter deposition, the wetting layer having a thickness within the range of about 25 Å to about 200 Å on the sidewall of a contact via formed in the substrate; and (c) depositing a layer of aluminum over the titanium wetting layer using traditional sputter deposition at a substantially constant substrate temperature which is selected to be within the range of about 380° C. to about 500° C., wherein the deposition rate of the aluminum layer is increased as the deposition progresses.

The method of the invention can be performed in a single processing chamber. Because the method does not include a nucleation step, there is no need to operate the process over a temperature range of more than 450° C., as there is when the single-chamber prior art process described above is used. Since the process of the present invention can be operated over a temperature range of about 120° C., the method can be performed more efficiently and rapidly.

Because the method of the invention pertains to second (and higher) layer metallization of multi-layered semiconductor structures, there is typically no need for deposition of a barrier layer of a refractory metal compound (such as titanium nitride) prior to deposition of the titanium wetting layer, because intermigration of potentially reactive materials is not a problem.

Also disclosed herein is a physical vapor deposition apparatus including at least one vacuum workpiece processing chamber and a programmable control device for controlling process variables within the processing chamber. The control device is programmed to vary the power to an aluminum-comprising sputtering target during deposition of an aluminum layer, so as to increase the deposition rate of the aluminum. The control device is programmed to enable the deposition of the first 15–35% of the aluminum layer using a DC target power of about 0.5 kW to about 1.5 kW, the second 50–70% of the aluminum layer using a DC target power of about 2.0 kW to about 3.5 kW, and the last 10–30% of the aluminum layer using a DC target power of about 10 kW to about 14 kW. The control device is programmed to enable the deposition of the first 15–35% of the aluminum layer at a field surface deposition rate of about 15 Å to about 45 Å of aluminum per second, the second 50–70% of the aluminum layer at a field surface deposition rate of about 60 Å to about 105 Å of aluminum per second, and the last 10–30% of the aluminum layer at a field surface deposition rate of about 300 Å to about 420 Å of aluminum per second.

DETAILED DESCRIPTION OF THE INVENTION

Figure 1:
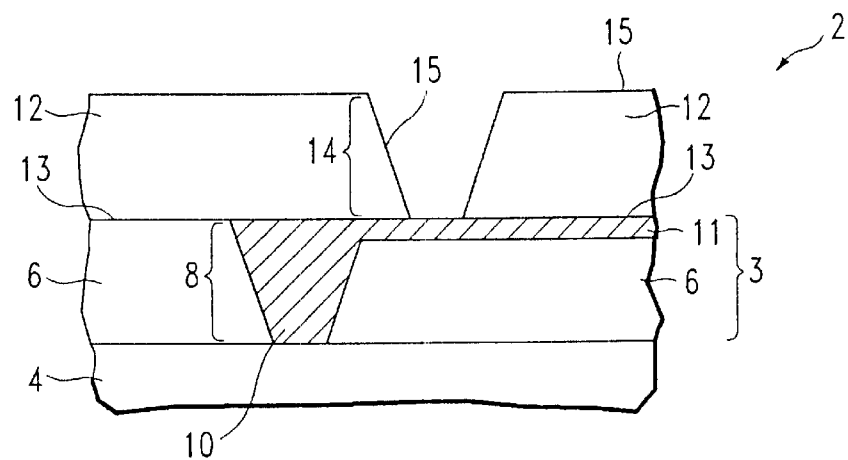
FIG. 1 shows a representative, multi-layered semiconductor structure having a patterned dielectric surface.

The present invention pertains to a method for performing second layer metallization of multi-layered semiconductor structures without need for deposition of a nucleation layer of metal. In particular, applicants have discovered a specialized set of process variables which enable second layer metallization of multi-layered semiconductor structures within a single processing chamber without need for a reflow step to fill voids formed during metallization. The method of the invention is particularly useful for second layer metallization of contact vias having aspect ratios up to about 4:1.

I. DEFINITIONS

As a preface to the detailed description, it should be noted that, as used in this specification and the appended claims, the singular forms "a", "an", and "the" include plural referents, unless the context clearly dictates otherwise. For example, "a contact via" refers to one or more contact vias.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "bottom coverage" refers to the ratio of the thickness of the film layer deposited at the bottom of an interconnect feature, such as a contact via, to the thickness of the film layer deposited on the field surface, expressed as a percentage. For example, if the layer of film deposited at the bottom of a contact via has a thickness of 1 $\mu$m, and the layer of film deposited on the field surface has a thickness of 10 $\mu$m, the bottom coverage of the film would be 10%.

The term "completely filled" refers to the characteristic of a feature, such as a trench or via, which is filled with a conductive material, wherein there is essentially no void space present within the portion of the feature filled with conductive material.

The term "feature" refers to contacts, vias, trenches, and other structures which make up the topography of the substrate surface.

The term "feature size" typically refers to the smallest dimension of a feature (i.e., the shortest distance between the sidewalls of a feature).

The term "ion sputter deposition" or "Ion Metal Plasma ("IMP") sputter deposition" refers to sputter deposition, preferably magnetron sputter deposition (where a magnet array is placed behind the target), where a high density, inductively coupled RF source is positioned between the sputtering cathode and the substrate support electrode, whereby at least a portion of the sputtered emission is in the form of ions at the time it reaches the substrate surface. In ion deposition sputtering, the percentage of target material which is ionized ranges from 10% up to about 90%.

The term "traditional sputtering" refers to a method of forming a film layer on a substrate wherein a target is sputtered and the material sputtered from the target passes between the target and the substrate to form a film layer on the substrate, and no secondary means is provided to ionize a substantial portion of the target material sputtered from the target before it reaches the substrate. The power to maintain the plasma and thus provide the ions to sputter the target is provided, for example, through the target, which is negatively biased DC, or obtains a negative self-bias when AC powered. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

II. APPARATUS FOR PRACTICING THE INVENTION

Deposition of film layers may be carried out using the Applied Materials, Inc. (Santa Clara, Calif.) Endurag Integrated Processing System. The system is shown and described in U.S. Pat. No. 5,186,718, the disclosure of which is hereby incorporated by reference herein in its entirety. A particularly preferred physical vapor deposition apparatus includes a programmable control device for controlling process variables within the processing chamber. The control device is programmed to vary the power to an aluminum-comprising sputtering target during deposition of an aluminum layer, as a means of increasing the deposition rate of the aluminum as deposition progresses. Dry etching of contact vias may be carried out using a multi-chamber processing system, such as the Applied Materials, Inc. Centura® Integrated Processing System.

III. THE METHOD FOR PERFORMING SECOND LAYER METALLIZATION OF CONTACT VIAS USING A SINGLE METALLIZATION STEP

The improved method of the invention for forming a multi-layered aluminum-comprising structure on a substrate having a patterned dielectric surface comprises the following general steps:
(a) sputter etching the patterned dielectric surface;
(b) depositing at least one continuous wetting layer of titanium over the patterned dielectric surface using ion sputter deposition, the wetting layer having a thickness within the range of about 25 Å to about 200 Å on the sidewall of a contact via formed in the substrate; and
(c) depositing a layer of aluminum over the titanium wetting layer using traditional sputter deposition at a substantially constant substrate temperature which is selected to be within the range of about 380° C. to about 500° C., wherein the deposition rate of the aluminum layer is increased as the deposition progresses.

Figure 2:
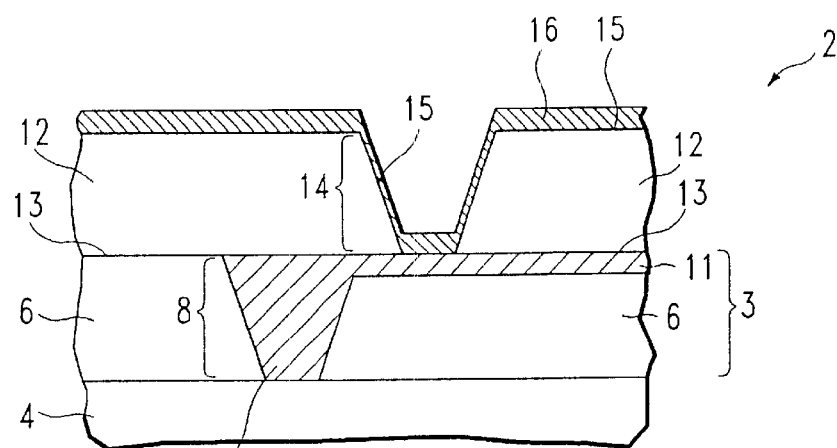
FIG. 2 shows the semiconductor structure of FIG. 1 following ion sputter deposition of a wetting layer of titanium over the patterned dielectric surface.
Figure 3:
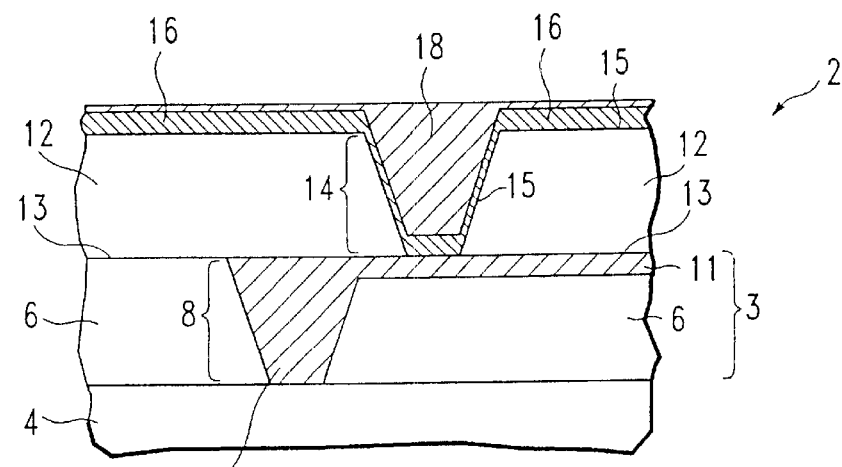
FIG. 3 shows the semiconductor structure of FIG. 2 following traditional sputter deposition of a layer of aluminum over the titanium wetting layer.

An example of a multi-layered semiconductor structure which can be prepared according to the method of the invention is illustrated in FIGS. 1–3.

FIG. 1 shows a representative, multi-layered semiconductor structure 2 prior to performance of the method of the invention. The first layer 3 of multi-layered semiconductor structure 2 is formed on a substrate 4. The substrate 4 typically comprises a semiconductor material, for example, silicon, gallium arsenide, indium phosphide, aluminum phosphide, gallium indium phosphide, germanium, or cadmium telluride.

The first layer 3 of the semiconductor structure 2 includes a patterned dielectric layer 6, which directly overlies the substrate 4. Reference numeral 8 designates a contact via formed within the dielectric layer 6. The contact via 8 has been completely filled with a layer 10 of aluminum, and excess aluminum has been removed from the field surface 1.

Overlying the first layer 3 of the semiconductor structure 2 is a patterned dielectric layer 12. The reference numeral 14 designates a contact via formed within the dielectric layer 12, and the reference numeral 11 designates an interconnect formed within the dielectic layer 12.

The patterned dielectric layer 12 preferably comprises a material selected from the group consisting of silicon dioxide, titanium dioxide, silicon oxynitride, fluorine-doped silicon dioxide, TEOS, spin-on glass (SOG), low-k dielectric materials (i.e., materials having a dielectric constant which is less than that of silicon dioxide, such as polytetrafluoroethylene, benzocyclobutene, parylene, or polyimide), and amorphous carbon, and is most preferably silicon dioxide.

Prior to performance of the method of the invention, a lamp degas step may be performed in order to remove moisture from the surface of the substrate and/or volatiles present in organic dielectric materials or volatiles left behind after processing steps such as chemical vapor deposition of the various layers of the semiconductor structure. Lamp degas is typically performed for approximately 30 seconds at 60% power to the heating lamp, followed by 30 seconds at 40% power to the heating lamp, where the surface of the substrate reaches a temperature of approximately 350° C. Alternatively, lamp degas can be performed for approximately 60 seconds at 50% power to the heating lamp, to attain the desired 350° C. substrate temperature. The power to the heating lamp is not a critical factor during the degassing step.

A high temperature PVD degas step may be performed if the substrate contains large quantities of volatile contaminants, as is the case for materials such as spin-on glass. However, PVD degas is generally not recommended, because it increases the chamber temperature, which may tend to damage device elements on the substrate and appears to lead to the formation of voids in the aluminum fill layer.

The first step of the method of the invention comprises sputter etching the patterned surface 15 of dielectric layer 12 to remove residual contaminants prior to deposition of the titanium wetting layer. The sputter etch step cleans the bottom of the contact via to expose bare metal, and typically removes about 200 Å of native oxide. Further, the sputter etching removes general debris from the patterned surface. Sputter etching is carried out using the inductively coupled plasma (ICP) technique. Typical process conditions for the inductively coupled plasma sputter etch step are as follows: 125 W DC power to pedestal, 300 W RF power to coil, 0.5 mT process chamber pressure, −250 V DC applied bias, 300–350° C. process chamber temperature.

The sputter etch step also functions to round the via opening corners, which provides an improvement in the aluminum flow characteristics. The top via corners are rounded to be convex and the bottom via corners are rounded to be concave. The effect of via corner rounding on flow properties is discussed by Gongda Yao in "Local Thermodynamic Analysis for Aluminum Planarization" (Applied Materials HP PVD Update, Vol. 2, No. 4, pp. 10–12, December 1995), the disclosure of which is hereby incorporated by reference. As discussed in the Yao article, atoms tend to flow from convex toward concave surfaces due to thermodynamic considerations. Also provided in this article are equations for calculating material flux for given contact sizes and radii of curvature.

U.S. Pat. No. 5,371,042, issued Dec. 6, 1994 to Ong, and assigned to the assignee of the present invention, discloses a process for "faceting" the top corners of contact openings in silicon oxide, which is accomplished by sputter etching about 300 Å of the silicon oxide layer in argon plasma. The disclosure of the foregoing patent is hereby incorporated by reference in its entirety.

The degas and sputter etch steps can be performed, for example, in a multi-chamber processing system, such as Applied Materials' Endura® Integrated Processing System, just prior to deposition of the titanium wetting layer.

As illustrated in FIG. 2, the second step of the method of the invention comprises depositing at least one continuous wetting layer 16 of titanium over the patterned dielectric surface 12. The titanium wetting layer must be smooth, continuous, and thick enough to serve as an effective wetting layer, yet thin enough that the potential for reaction of the titanium with the aluminum fill is minimized.

When the titanium is deposited using ion sputter deposition techniques, the thickness of the titanium layer on the sidewalls of a contact via is typically about 15–30% of the field surface thickness; the thickness of the titanium layer at the bottom of a contact via is typically about 30–40% of the field surface thickness. In a contact via having a field surface thickness of 300 Å, the sidewall thickness would be about 45–90 Å, and the bottom thickness would be approximately 90–120 Å.

The thickness of the titanium layer at the field surface is preferably within the range of about 100 Å to about 350 Å; more preferably, about 200 Å to about 350 Å; most preferably, about 300 Å. As the field thickness increases over about 300 Å, there is a greater potential for overhang at the top via corners, which makes filling of the contact more difficult.

The thickness of the titanium wetting layer on the sidewalls of the contact via is preferably within the range of about 25 Å to about 200 Å; more preferably, about 50 Å to about 150 Å; most preferably, about 50 Å to about 100 Å. As the thickness of the titanium wetting layer on the sidewalls of a contact via increases over about 150 Å, there is a risk that the aluminum will not flow properly due to an increased risk of reaction of the titanium with the aluminum fill. Excessive sidewall thickness also effectively increases the aspect ratio of the contact via, making it more difficult to fill.

The titanium wetting layer must have a minimum thickness of about 50 Å at the bottom of the contact for acceptable via resistance.

The titanium wetting layer 16 is deposited over the surface 15 of patterned dielectric layer 12 using ion sputter deposition techniques. A representative ion sputter deposition method is described by S. M. Rossnagel and J. Hopwood in their papers "Metal ion deposition from ionized magnetron sputtering discharge", *J. Vac. Sci. Technol. B*, Vol. 12, No. 1 (January/Febuary 1994) and "Thin, high atomic weight refractory film deposition for diffusion barrier, adhesion layer, and seed layer applications", *J. Vac. Sci. Technol. B*, Vol. 14, No. 3 (May/June 1996).

In particular, ion sputter deposition refers to deposition sputtering where sputtered target material is passed through an ionization means, such as an inductively coupled RF source, to create a high density, inductively coupled RF plasma between the sputtering cathode (target) and the substrate support electrode. This ensures that a higher portion of the sputtered emission is in the form of ions at the time it reaches the substrate surface. The substrate toward which the sputtered ions are moving is typically biased to attract the incoming ions; however, in the titanium deposition step of the present invention, substrate bias power is preferably not used.

Our goal was to obtain greater deposition of titanium on the sidewalls of the contact via and less titanium deposition at the bottom of the via. Therefore, we used a high DC target power, a comparatively low RF coil power, a low process chamber pressure, and no substrate bias power. When the Endura® Integrated Processing System is used, the DC target power is preferably within the range of about 4 kW to about 12 kW; more preferably, about 8 kW to about 12 kW; most preferably, about 8 kW. The RF coil power is preferably within the range of about 1 kW to about 3 kW; more preferably, about 1.5 kW to about 3 kW; most preferably, about 1.5 kW. The process chamber pressure is preferably within the range of about 10 mT to about 40 mT; more preferably, about 10 mT to about 35 mT; most preferably, about 10 mT.

Using a target power of approximately 8 kW, we obtained a rapid titanium deposition rate of approximately 50 Å per second on the field surface, approximately 12 Å per second on the sidewall of a contact via, and approximately 18 Å per second at the bottom of a contact via. The rapid deposition resulted in more titanium being deposited on the sidewalls than at the bottom of the contact via, and produced a uniform, thick film on the sidewalls of the via. The titanium is preferably deposited at a field surface deposition rate of about 20 Å to about 75 Å of titanium per second; more preferably, about 50 Å to about 75 Å of titanium per second; most preferably, about 50 Å of titanium per second.

The high target power also resulted in a smaller percentage of the titanium being ionized due to shorter plasma residence time. The relatively low coil power reduced the degree of ionization of the titanium. Since titanium ions tend to be attracted to the bottom of a contact via, reduction in the amount of ionized titanium reduced the amount of titanium which deposited at the bottom of the contact via.

As illustrated in FIG. 3, the third step of the method of the invention comprises depositing a layer 18 of aluminum over the titanium wetting layer 16. Because the method of the invention pertains to second (and higher) layer metallization of multi-layered semiconductor structures, intermigration of potentially reactive materials is not a problem. Therefore, there is no need for deposition of a barrier layer (such as titanium nitride) prior to deposition of the titanium wetting layer.

The layer 18 of aluminum is deposited over the titanium wetting layer 16 using traditional sputter deposition. The aluminum is preferably deposited at a substrate temperature within the range of about 380° C. to about 500° C.; more preferably, about 395° C. to about 445° C.; most preferably, about 405° C. to about 425° C. During deposition of the aluminum layer, the substrate temperature is held substantially constant (i.e., varying over a range of no more than about 5° C.) at a value selected from within the preferred temperature range.

When the substrate is held to the substrate support platen using mechanical clamping means, the substrate temperature will be approximately 55° C. lower than the temperature of the pedestal on which the substrate support the platen sits (i.e., a substrate temperature of approximately 405° C. will be obtained when a pedestal temperature of 460° C. is used). When the substrate is held to the substrate support platen by means of an electrostatic chuck (ESC), the substrate temperature will be typically about 20° C. lower than the pedestal temperature (i.e., if a substrate temperature of 405° C. is desired, a pedestal temperature of 425° C. should be employed). Electrostatic chucks are described in, for example, commonly assigned U.S. Pat. No. 5,730,803 to Steger et al., issued Mar. 24, 1998.

As the deposition of the aluminum layer progresses, the deposition rate of the aluminum is ramped up (i.e., increased) gradually to avoid the creation of voids in the filled area while reducing the processing time. Preferably, the first 15–35% of the aluminum layer is deposited using traditional sputter deposition at a field surface deposition rate of about 15 Å to about 45 Å of aluminum per second; the second 50–70% of the aluminum layer is deposited at a field surface deposition rate of about 60 Å to about 105 Å of aluminum per second; and the last 10–30% of the aluminum layer is deposited at a field surface deposition rate of about 300 Å to about 420 Å of aluminum per second. More preferably, the first 15–35% of the aluminum layer is deposited at a field surface deposition rate of about 20 Å to about 40 Å of aluminum per second; the second 50–70% of the aluminum layer is deposited at a field surface deposition rate of about 75 Å to about 90 Å of aluminum per second; and the last 10–30% of the aluminum layer is deposited at a field surface deposition rate of about 330 Å to about 390 Å of aluminum per second. Most preferably, the first 15–35% of the aluminum layer is deposited at a field surface deposition rate of about 30 Å of aluminum per second; the second 50–70% of the aluminum layer is deposited at a field surface deposition rate of about 85 Å of aluminum per second; and the last 10–30% of the aluminum layer is deposited at a field surface deposition rate of about 360 Å of aluminum per second.

Preferably, the deposition rate of the aluminum layer is increased by increasing the target power as deposition of the aluminum layer progresses. When the Endura® Integrated Processing System is used to deposit the aluminum layer, the first 15–35% of the aluminum layer is preferably deposited by traditional sputter deposition using a DC target power of about 0.5 kW to about 1.5 kW; the second 50–70%,of the aluminum layer is deposited using a DC target power of about 2.0 kW to about 3.5 kW; and the last 10–30% of the aluminum layer is deposited using a DC target power of about 10 kW to about 14 kW. More preferably, the first 15–35% of the aluminum layer is deposited using a DC target power of about 0.75–1.25 kW; the second 50–70% of the aluminum layer is deposited using a DC target power of about 2.5–3.0 kW; and the last 10–30% of the aluminum layer is deposited using a DC target power of about 11–13 kW. Most preferably, the first 15–35% of the aluminum layer is deposited using a DC target power of about 1 kW; the second 50–70% of the aluminum layer is deposited using a DC target power of about 2.8 kW; and the last 10–30% of the aluminum layer is deposited using a DC target power of about 12 kW. The last portion of the aluminum layer is deposited using a very high target power (i.e., 10–14 kW) in order to increase the reflectivity of the film.

Preferred process conditions for sputter deposition of the titanium wetting layer and the aluminum layer are set forth in Table 1, below.

TABLE 1

Process Conditions for Sputter Deposition of Titanium Wetting Layer and Aluminum Layer

| Layer | Preferred Process Conditions | More Preferred Process Conditions | Optimum Known Process Conditions |
|---|---|---|---|
| Ti | | | |
| Field Surface Thickness (Å) | 100–350 | 200–350 | 300 |
| Sidewall Thickness (Å) | 25–200 | 50–150 | 50–100 |
| Temperature (° C.) | 200 | 200 | 200 |
| Pressure (mT) | 10–40 | 10–35 | 10 |
| Gas | Ar | Ar | Ar |
| DC Target Power (kW) | 4–12 | 8–12 | 8 |
| RF Coil Power (kW) | 1–3 | 1.5–3 | 1.5 |
| Self-bias (−V) | 20–30 | 20–30 | 20–30 |
| Al | | | |
| Temperature (° C.) | 380–500 | 395–445 | 405–425 |
| Pressure (mT) | 1–3 | 1–3 | 2 |
| Gas | Ar | Ar | Ar |
| DC Target Power (kW) | | | |
| First 15–35% | 0.5–1.5 | 0.75–1.25 | 1 |
| Second 50–70% | 2.0–3.5 | 2.5–3.0 | 2.8 |
| Last 10–30% | 10–14 | 11–13 | 12 |

Although argon is preferred, the plasma source gas used in the performance of the method of the invention may be any of the heavier noble gases, for example, xenon, krypton, or neon.

Table 2, below, presents a summary of the results obtained using various aluminum metallization techniques, where the dielectric surface was deposited using TEOS.

TABLE 2

| Type | Process | Comments |
|---|---|---|
| Sputter etch | Yes | No voids |
| Ti layer thickness (Å) | 300 | |
| Al metallization process | One-step warm | |
| Reflow | No | |
| Sputter etch | Yes | No voids |
| Ti layer thickness (Å) | 300 | |
| Al metallization process | One-step warm | |
| Reflow | Yes | |
| Sputter etch | No | Number of voids |
| Ti layer thickness (Å) | 300 | |
| Al metallization process | One-step warm | |
| Reflow | Yes | |
| Sputter etch | No | Number of voids |
| Ti layer thickness (Å) | 300 | |
| Al metallization process | One-step warm | |
| Reflow | No | |

Lamp degas was performed for 30 seconds at 60% power to the heating lamp, then for 30 seconds at 40% power to the heating lamp. Where used, sputter etch was performed using 300 W RF power to the plasma source generation ionization coil and 125 W DC power to the pedestal, in order to clean off debris from the patterned silicon dioxide (i.e., dielectric) surface prior to deposition of the titanium wetting layer. Other sputter etch process conditions were as follows: 0.5 mT process chamber pressure, −250 V DC applied bias, 300–350° C. process chamber temperature.

The titanium wetting layer was deposited by ion sputter deposition in an Endura® Integrated Processing System using 8 kW DC power to titanium target and 1.5 kW RF power to the coil used as the source for ion generation, and no bias power. (A self bias of about −20 to −30 V is typical.)

The process gas was argon, with 10 mT process chamber pressure (19 sccm argon process). The pedestal (i.e., substrate support platen) temperature was about 200° C.

High temperature aluminum metallization was performed by ramping up the target power during traditional sputter deposition of aluminum, as follows: 2400 Å of aluminum was deposited on the field surface at 1 kW DC power to target, 4500 Å of aluminum was deposited on the field surface at 2.8 kW DC power to target, and 1000 Å aluminum was deposited on the field surface at 12 kW DC power to target. The process gas was argon, with 1 mT process chamber pressure and 7–8 T backside pressure on the substrate platen (35 sccm argon process and 15 sccm backside leak rate). The substrate temperature ranged from about 400–425 ° C.

If desired, a reflow step can be performed by leaving the substrate on the heated substrate support platen for 60 seconds after the power is turned off, following aluminum deposition. A reflow step has been determined not to be critical.

The present invention provides a method for performing second (or third, or fourth, or fifth, etc.) layer aluminum metallization of multi-layered semiconductor structures within a single chamber, without need for deposition of a nucleation layer of aluminum, and without need for a reflow step to fill voids created during metallization.

The method of the invention is useful for second layer metallization of contact vias having aspect ratios up to about 4:1 and feature sizes of approximately 0.3 μm to 1.2 μm. The method of the invention is particularly useful for second layer metallization of shallow contact vias having aspect ratios of about 3:1 or less.

The above described preferred embodiments are not intended to limit the scope of the present invention, as one skilled in the art can, in view of the present disclosure, expand such embodiments to correspond with the subject matter of the invention claimed below.

We claim:

1. A physical vapor deposition apparatus including at least one workpiece processing chamber and a programmable control device for controlling process variables within said processing chamber, wherein said control device contains instructions to vary the power to an aluminum-comprising sputtering target during deposition of an aluminum layer, wherein the rate of aluminum deposition is increased as deposition proceeds, and wherein said control device contains instructions to enable the deposition of the first 15–35% of said aluminum layer using a DC target power of about 0.5 kW to about 1.5 kW, the second 50–70% of the aluminum layer using a DC target power of about 2.0 kW to about 3.5 kW, and the last 10–30% of the aluminum layer using a DC target power of about 10 kW to about 14 kW, and wherein said control device contains instructions to control said workpiece surface at a temperature ranging between about 380° C. and about 500° C. during said aluminum deposition, whereby features are completely filled in a patterned semiconductor substrate.

2. The physical vapor deposition apparatus of claim 1, wherein said instructions include that said first 15–35% of said aluminum layer is deposited using a DC target power ranging from about 0.75 kW to about 1.25 kW, said second 50–70% of said aluminum layer is deposited using a DC target power ranging from about 2.5 kW to about 3.0 kW, and said last 10–30% of said aluminum layer is deposited using a DC target power ranging from about 11 kW to about 13 kW.

3. The physical vapor deposition apparatus of claim 2, wherein said instructions include that said first 15–35% of said aluminum layer is deposited using a DC target power of about 1.0 kW, said second 50–70% of said aluminum layer is deposited using a DC target power of about 2.8 kW, and said last 10–30% of said aluminum layer is deposited using a DC target power of about 12 kW.

4. The physical vapor deposition apparatus of claim 2, wherein said instructions include that said aluminum deposition is continuous during deposition of said aluminum layer.

5. The physical vapor deposition apparatus of claim 1, wherein said instructions include that said aluminum deposition is continuous during deposition of said aluminum layer.

6. A physical vapor deposition apparatus including at least one workpiece processing chamber and a programmable control device for controlling process variables within said processing chamber, wherein said control device contains instructions to vary the power to an aluminum-comprising sputtering target during deposition of an aluminum layer, wherein the rate of aluminum deposition is increased as deposition proceeds, and wherein said control device contains instructions to enable the deposition of the first 15–35% of said aluminum layer at a field surface deposition rate of about 15 Å to about 45 Å of aluminum per second, the second 50–70% of said aluminum layer at a field surface deposition rate of about 60 Å to about 105 Å of aluminum per second, and the last 10–30% of said aluminum layer at a field surface deposition rate of about 300 ↑ to about 420 Å of aluminum per second, whereby features are completely filled in a patterned semiconductor substrate.

7. The physical vapor deposition apparatus of claim 6, wherein said instructions include that said first 15–35% of said aluminum layer is deposited at a field surface deposition rate ranging from about 20 Å to about 40 Å of aluminum per second, said second 50–70% of said aluminum layer is deposited at a field surface deposition rate ranging from about 75Å to about 90 Å of aluminum per second, and said last 10–30% of said aluminum layer is deposited at a field surface deposition rate ranging from about 330 Å to about 390 Å of aluminum per second.

8. The physical vapor deposition apparatus of claim 7, wherein said instructions include that said first 15–35% of said aluminum layer is deposited at a field surface deposition rate of about 30 Å of aluminum per second, said second 50–70% of said aluminum layer is deposited at a field surface deposition rate of about 85 Å of aluminum per second, and said last 10–30% of said aluminum layer is deposited at a field surface deposition rate of about 360 Å of aluminum per second.

9. The physical vapor deposition apparatus of claim 7, wherein said instructions include that said aluminum deposition is continuous during deposition of said aluminum layer.

10. The physical vapor deposition apparatus of claim 6, wherein said control device also contains instructions to control said workpiece surface at a temperature ranging between about 380° C. and about 500° C. during said aluminum deposition.

11. The physical vapor deposition apparatus of claim 10, wherein said instructions include that said aluminum deposition is continuous during deposition of said aluminum layer.

12. The physical vapor deposition apparatus of claim 6, wherein said instructions include that said aluminum deposition is continuous during deposition of said aluminum layer.

* * * * *